United States Patent [19]

Leyva et al.

[11] Patent Number: 5,335,098
[45] Date of Patent: Aug. 2, 1994

[54] FIXING METHOD FOR NARROW BANDWIDTH VOLUME HOLOGRAMS IN PHOTOREFRACTIVE MATERIALS

[75] Inventors: Victor Leyva, Los Angeles; George A. Rakuljic, Santa Monica, both of Calif.

[73] Assignee: Accuwave Corporation, Santa Monica, Calif.

[21] Appl. No.: 965,746

[22] Filed: Oct. 23, 1992

Related U.S. Application Data

[63] Continuation-in-part of Ser. No. 908,298, Jul. 2, 1992, which is a continuation-in-part of Ser. No. 736,736, Jul. 26, 1991, abandoned.

[51] Int. Cl.$^5$ .................. G02B 5/32; G03H 1/18; G03H 1/26
[52] U.S. Cl. ............................. 359/7; 359/1; 359/15; 359/22
[58] Field of Search ............ 359/4, 7, 21, 10, 11, 359/22, 15, 1

[56] References Cited

U.S. PATENT DOCUMENTS

| | | | |
|---|---|---|---|
| 3,383,664 | 5/1968 | Chen et al. | 365/121 |
| 3,512,879 | 5/1970 | Reynolds et al. | 365/94 |
| 3,544,189 | 12/1970 | Chen et al. | 359/4 |
| 3,627,400 | 12/1971 | Caulfield | 359/25 |
| 3,703,328 | 11/1972 | Glass et al. | 359/7 |
| 3,773,400 | 11/1973 | Amodei et al. | 359/7 |
| 3,799,642 | 3/1974 | Phillips et al. | 359/7 |
| 3,873,179 | 3/1975 | Burke | 359/7 |
| 3,912,391 | 10/1975 | Fleisher et al. | 355/554 |
| 3,915,549 | 10/1975 | Amodei et al. | 359/7 |
| 3,932,299 | 1/1976 | Phillips | 252/300 |
| 3,933,504 | 1/1976 | Phillips et al. | 430/2 |
| 3,997,350 | 12/1976 | Ikeo et al. | 359/7 |
| 4,052,119 | 10/1977 | Williams et al. | 359/7 |
| 4,062,618 | 12/1977 | Steensma | 359/11 |
| 4,094,575 | 6/1978 | Kellie | 359/10 |
| 4,111,524 | 9/1978 | Tomlinson, III | 385/37 |
| 4,153,330 | 5/1979 | Tomlinson, III | 385/35 |
| 4,198,117 | 4/1980 | Kobayashi | 385/37 |
| 4,336,976 | 6/1982 | Rodemann et al. | 359/22 |
| 4,362,359 | 12/1982 | Dammann et al. | 385/37 |
| 4,420,217 | 12/1983 | Gerharz | 359/4 |
| 4,420,829 | 12/1983 | Carlson | 369/103 |
| 4,449,785 | 5/1984 | Huignard et al. | 359/3 |
| 4,452,533 | 6/1984 | Miles et al. | 356/352 |
| 4,522,462 | 6/1985 | Large et al. | 385/37 |
| 4,643,519 | 2/1987 | Bussard et al. | 385/37 |
| 4,669,811 | 6/1987 | McQuoid et al. | 359/15 |
| 4,671,603 | 6/1987 | McQuoid et al. | 359/15 |
| 4,726,655 | 2/1988 | Mahlein | 359/588 |
| 4,759,596 | 4/1988 | Po et al. | 835/37 |
| 4,770,496 | 9/1988 | Mahlein | 359/588 |
| 4,773,063 | 9/1988 | Hunsperger et al. | 370/3 |
| 4,805,185 | 2/1989 | Smith | 372/97 |
| 4,810,047 | 3/1989 | Pernick | 359/19 |
| 4,824,193 | 4/1989 | Maeda et al. | 359/34 |
| 4,879,167 | 11/1989 | Chang | 428/215 |
| 4,907,237 | 3/1990 | Dahmani et al. | 372/32 |
| 4,919,532 | 4/1990 | Mocker et al. | 356/28.5 |
| 4,923,270 | 5/1990 | Carter | 359/127 |
| 4,926,412 | 5/1990 | Jannson et al. | 370/3 |
| 4,927,220 | 5/1990 | Hesselink et al. | 359/7 |
| 4,965,152 | 10/1990 | Keys et al. | 430/1 |
| 5,026,131 | 6/1991 | Jannson et al. | 359/15 |
| 5,082,337 | 1/1992 | Chern et al. | 359/15 |
| 5,107,359 | 4/1992 | Ohuchida | 359/124 |
| 5,119,454 | 6/1992 | McMahon | 385/49 |

OTHER PUBLICATIONS

David M. Pepper et al., "The Photorefractive Effect," *Scientific American*, Oct. 1990.

(List continued on next page.)

*Primary Examiner*—William L. Sikes
*Assistant Examiner*—David R. Parsons
*Attorney, Agent, or Firm*—Merchant, Gould, Smith, Edell, Welter & Schmidt

[57] ABSTRACT

An improved method for storing permanent holographic gratings in photorefractive materials for use in narrow band filters such as the $H_{60}$ filter, as well as the filters themselves. The invention also provides an improved method of controlling the electric field and the nature of the photorefraction to minimize wavelength shifts and band broadening at a minimal reduction of diffraction efficiency.

33 Claims, 6 Drawing Sheets

OTHER PUBLICATIONS

Vladimirtsev et al., "Optical Damage in Transition Metal Doped Ferroelectric," *Ferroelectrics*, vol. 22, 1978, pp. 653–654.

A. M. Glass, "The Photorefractive Effect," *Optical Engineering*, vol. 17, No. 5, p. 470 (Sep.–Oct. 1978).

Meyer et al., "Kinetics of Fixation of Phase Holograms in $LiNbO_3$," *Phys. Stat. Sol.* (a) vol. 53, p. 171 (1979).

Hertel et al., "Theory of Thermal Hologram Fixing and Application to $LiNbO_8:Cu^2$:" *Phys. Stat. Sol.* (a) vol. 104, p. 844, (1987).

W. Phillips et al., "Optical and Holographic Storage Properties of Transition Metal Doped Lithium Niobate," *RCA Review*, vol. 33, p. 94, (Mar. 1972).

Staebler et al., "Multiple Storage and Erasure of Fixed Holograms in Fe-doped $LiNbO_3$," *Applied Physics Letters*, vol. 26, No. 4, p. 182 (Feb. 15, 1975).

Staebler et al., "Thermally Fixed Holograms in $LiNbO_3$," *Ferroelectrics*, vol. 3, p. 107 (1972).

Amodei et al., "Holographic Pattern Fixing in Electro-Optic Crystals," *Applied Physics Letters*, vol. 18, No. 12, p. 540, (Jun. 15, 1971).

K. Blotekjaer, "Limitations on Holographic Storage Capacity of Photochromic and Photorefractive Media," *Applied Optics*, vol. 18, No. 1, p. 57 (Jan. 1, 1979).

W. V. Smith, "Large Capacity Holographic Memory," *IBM Technical Disclosure Bulletin*, vol. 15, No. 3, Aug. 1972.

Thomas Stone and Nicholas George, "Hybrid Diffractive-Refractive Lenses and Achromats," *Applied Optics*, vol. 27, No. 14, Jul. 15, 1988.

N. V. Kukhtarev et al., "Holographic Storage in Electrooptic Crystals. I. Steady State," *Ferroelectrics*, vol. 22, pp. 949–960, 1979.

Tom Parish, "Crystal Clear Storage," *BYTE*, p. 283, Nov. 1990.

S. W. McCahon et al., "Hologram Fixing in $Bi_{12}TIO_{20}$ Using Heating and an AC Electric Field," *Applied Optics*, vol. 28, No. 11, Jun. 1, 1989.

G. D. Stucky et al., "Quantum Confinement and Host-Guest Chemistry: Probing a New Dimension," *Science*, Feb. 9, 1990.

J. F. Scott et al., "Ferroelectric Memories," *Science*, vol. 246, p. 1400.

B. I. Greene, "All-Optical nonlinearities in Organics," *Science*, Feb. 9, 1990.

Amnon Yariv et al., "High Resolution Volume Holography using Orthogonal Data Storage," *OSA Topical Meeting on Photorefractive Materials*, Jul. 1991, pp. 130–132.

D. W. Woodbury et al., "Hologram Indexing in $LiNbO_3$ With A Tunable Pulsed Laser Source," *Applied Optics*, vol. 18, No. 15, Aug. 1, 1979, pp. 2555–2558.

W. J. Burke et al., "Volume Phase Holographic Storage in Ferroelectric Crystals," *Optical Engineering*, vol. 17, No. 4, Jul.–Aug. 1978, pp. 308–316.

C. Gu et al., "Diffraction Properties of Fixed Gratings in Photorefractive Media," *Journal of the Optical Society of America B: Optical Physics*, vol. 7, No. 12, Dec. 1990, pp. 2339–2346.

S. Wu et al., "Reconfigurable Interconnections Using Photorefractive Holograms," *Applied Optics*, vol. 29, No. 8, Mar. 10, 1990, pp. 1118–1125.

FIXING METHOD FOR NARROW BANDWIDTH VOLUME HOLOGRAMS IN PHOTOREFRACTIVE MATERIALS

CROSS REFERENCE TO RELATED APPLICATIONS

This is a continuation-in-part of application Ser. No. 07/908,298, entitled "Photorefractive Systems and Methods," filed Jul. 2, 1992, by G. A. Rakuljic and A. Yariv, which is a continuation-in-part of application Ser. No. 07/736,736, entitled "Photorefractive Systems and Methods," filed Jul. 26, 1991, by G. A. Rakuljic and A. Yariv, now abandoned both of which applications are incorporated by reference herein.

BACKGROUND OF THE INVENTION

1. Field of the Invention

The present invention relates to storing permanent narrow linewidth volume holograms in photorefractive materials and more specifically to narrow bandwidth (sub-Angstrom) filters using volume holograms and methods of making the same.

2. Description of Related Art

Methods of writing and fixing high diffraction efficiency, counter-propagating reflection holograms in photorefractive materials have been described by the above-referenced parent patent applications. One example of use of this technology is extremely narrow bandwidth reflection filters with sub-Angstrom full-width-at-half-maximum (FWHM) response. Such filters can be used, for example, in solar astronomy to image the sun at $H_\alpha$ or other absorption bands. Improved filters are fabricated by recording curved (i.e., spherical) volume holographic gratings in $LiNbO_3$ and fixing the holograms to render them permanent so they will not be erased by illumination during use or by thermal decay during storage or shipping. The parent patent applications by G. A. Rakuljic and A. Yariv, supra, also describe an improved method of fixing holograms written in photorefractive materials such as $LiNbO_3$ with very high fixing efficiency, i.e., with little loss in diffraction efficiency in the conversion from the pre-fixed to permanent gratings.

Holograms were first fixed in $LiNbO_3$ by a group at RCA Laboratories (J. J. Amodei and D. L. Staebler, "Holographic recording in lithium niobate," *RCA Review*, vol. 33, pp. 71-94 (1972) ). The fixing methods of the parent patent applications by G. A. Rakuljic and A. Yariv, supra, which have been verified by a systematic analysis of the photorefractive charge transport equations developed by N. V. Kukhtarev, et al. ("Holographic storage in electro-optic crystals. I. Steady state," *Ferroelectrics* vol. 22, pp. 949-960 (1979)), involve control of temperature and electric fields in the crystal to obtain high fixed diffraction efficiencies. Holograms are stored in photorefractive materials in the form of an electronic grating resulting from light-induced migration of photo-excited electrons. The electro-optic properties of the material induce index of refraction variations generated by the spatial electric field distribution resulting from the electronic grating. The fixing and developing processes involve generating an ionic grating to compensate the metastable electronic grating, then removing the original electronic grating to leave only a permanent ionic grating that cannot be erased by illumination. This is done by first heating the crystal to a temperature where the ions become mobile so they migrate to compensate the electronic grating, and controlling the electric fields in the crystal during the process to achieve the highest possible ionic grating strength. The main steps in this process, as described in the parent patent applications by G. A. Rakuljic and A. Yariv, supra, are:

The grating is written in the crystal while it is shorted to neutralize all internal fields. A transparent conducting material such as carbon film or thin metal layer is used to coat the surfaces of the crystal in order to short it while allowing light through its faces. This generates an index grating generated by an electronic space charge distribution that will decay with time or illumination.

The crystal is heated to its fixing temperature, usually around 160° C., while it is shorted by being wrapped in foil so the ions become mobile and compensate the electron grating. The crystal is held at the high temperature for a few minutes, and cooled back to room temperature.

The foil is removed and the crystal cleaned so it becomes a good insulator. The crystal is illuminated by intense light while held in the open circuit state to allow large fields to build up in the crystal through the photovoltaic effect and to enhance the erasure of the original electronic grating, leaving only the permanent ionic grating (developing).

The preceding steps describe the sequential writing and fixing process. An alternate process, the simultaneous writing and fixing case, comprises the following steps:

The crystal is shorted with a transparent conducting material as in the previous example of sequential writing and fixing and heated to the fixing temperature of approximately 160° C.

The grating is written in the crystal at the elevated temperature and cooled back to room temperature.

The shorting material is removed and the crystal illuminated by an intense light while open circuited as in the previous example.

These novel processes allow very narrow bandwidth holograms to be established in thick (up to 8 mm thick) crystals with high dopant concentrations (0.1% Fe). As an unexpected consequence, however, peak diffraction efficiencies and bandwidth characteristics are significantly below theoretical expectations. In some instances, wavelength shifts, multiple peaks, or bandwidth broadening beyond the width of the pre-fixed grating have been observed after the developing step. In other instances, these effects have been encountered after a crystal is used in the solar filter application for a period of time. One wishes to retain the high dopant level in a thick crystal so as to achieve a high diffraction efficiency, but it is also of significant importance that the extremely narrow band filter properties be retained during and after development.

SUMMARY OF THE INVENTION

To overcome the limitations in the prior art described above, and to overcome other limitations that will become apparent upon reading and understanding the present specification, the present invention discloses an improved method for storing permanent holographic gratings in as the $H_\alpha$ filter, as well as the filters themselves. The photorefractive materials for use in narrow band filters such present invention also discloses an improved method for controlling the electric field and the nature of the photorefraction to minimize wavelength shifts and band broadening at a minimal reduction of diffraction efficiency.

In accordance with the invention, a hologram is written with the photorefractive crystal electrically shorted, then sequentially or simultaneously fixed, again in shorted condition. The development phase is, however, carried out by broadband incoherent illumination through a transparent conductive coating so that the crystal is shorted and remains shorted during subsequent use. It is shown that non-uniform grating distributions and stress distributions are equalized and that photovoltaic and pyroelectric interactions do not tend to shift or broaden the grating wavelength.

The sequential writing and fixing process comprises writing holographic gratings in a photorefractive crystal in the counter-propagating geometry by using phase conjugate pairs of converging and diverging beams at the $H_\alpha$ absorption wavelength of 6562.8 Å (in air). Active wavelength control of the dye laser is utilized to ensure high quality, high diffraction efficiency gratings. The crystal is shorted during writing by coating the crystal with a thin film of carbon or metal. Alternately, a conductive, transparent anti-reflection coating on the surfaces of the crystal can be used to obtain the shorted condition.

After the hologram is written, the crystal is heated in a shorted condition so that the hologram is fixed. The fixing temperature and time vary with sample size, but generally is around 160° C. for 10 minutes for the thicker samples. The crystal is then cooled back to room temperature and developed by illuminating it with an incoherent light while it is shorted with a transparent conductive coating over its surface, in a similar manner as during the writing stage. The transparent short is also left in place when the crystal is exposed to light during operational use to avoid the buildup of internal fields.

In a simultaneous writing and fixing method, the crystal is shorted with the transparent conductive material in the same manner as described above and heated to the fixing temperature of around 160° C. The grating is written at a longer wavelength than desired for the final hologram to compensate for the thermal expansion of the crystal. The crystal is then cooled to room temperature and developed in the manner described above by illuminating it with incoherent light while it is shorted.

A narrow bandwidth filter system for imaging the sun at the $H_\alpha$ absorption line using a permanent volume holographic grating has been fabricated as an example of a filter meeting particularly stringent requirements. This filter is coated with a permanent transparent conductor and has a thickness of about 8mm, with a FWHM of 0.12 Å the grating being curved for maximum field of view and f-number matching. In the filter unit, beam traps comprised of neutral density filters are dispersed at Brewster's angle to eliminate surface reflections and absorb stray light to improve contrast. Solar images recorded using this filter unit have unsurpassed $H_\alpha$ illumination detail and contrast.

BRIEF DESCRIPTION OF THE DRAWINGS

A better understanding of the invention can be gained by reference to the following description, taken in conjunction with the accompanying drawings, in which.

DETAILED DESCRIPTION

In the following description of this embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
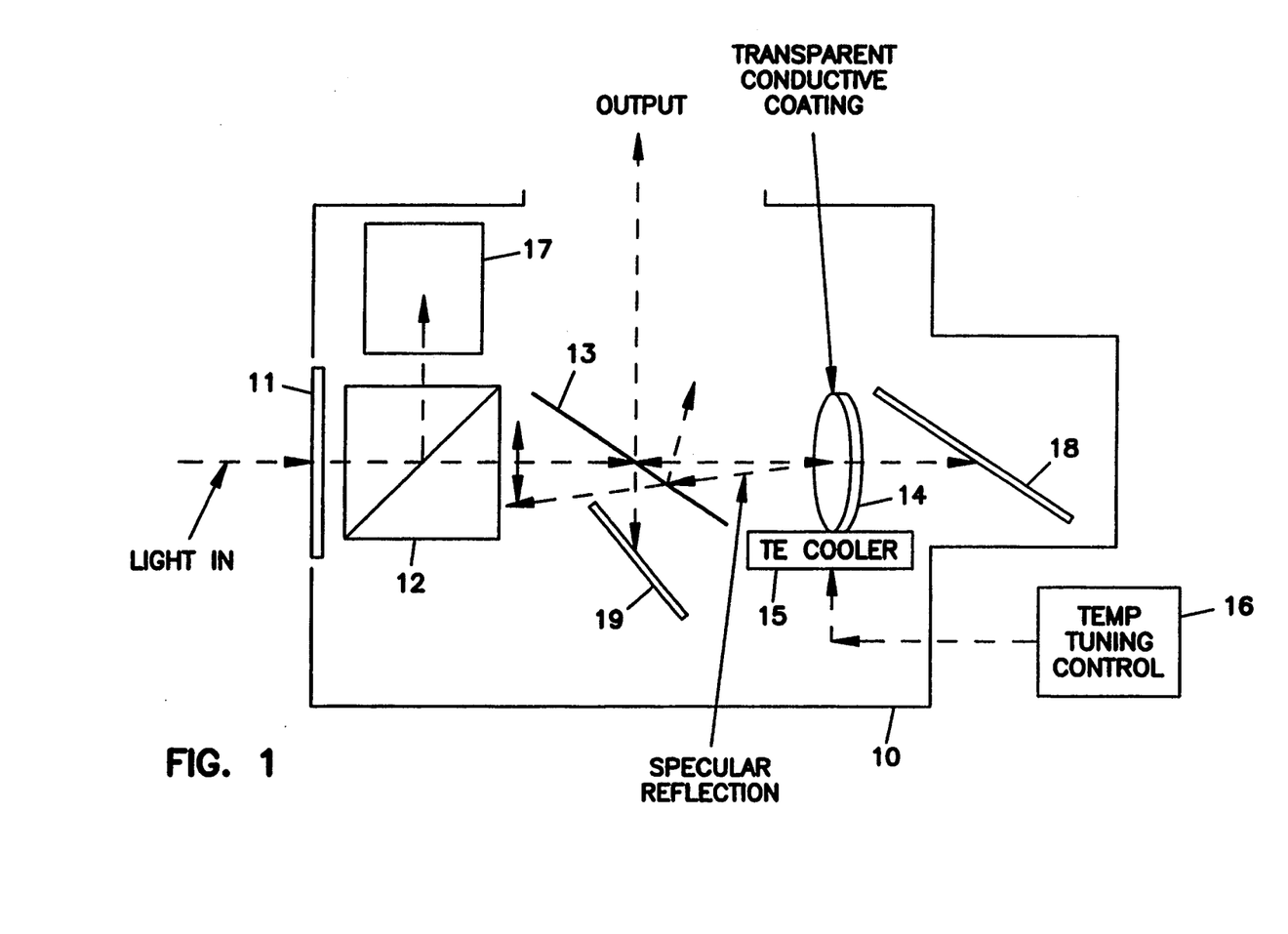
FIG. 1 is a schematic drawing of an $H_\alpha$ reflection filter using a volume holographic grating as the wavelength-selective element.

In FIG. 1, a narrow band optical filter 10 using a volume hologram reflection grating, as described in the parent patent applications by G. A. Rakuljic and A. Yariv, supra, is shown in schematic form. The incoming light is passed through a 10–20 Å bandpass prefilter 11 to improve contrast and is polarized by the polarizing beamsplitter 12 so that only one reflection (polarization) is scattered off the grating 14, which is tilted to send specular reflection off axis, and directed to the output by the beamsplitter 13. The holographic grating 14 used in this system is written in a photorefractive LiNbO$_3$ crystal with an anti-reflection (AR) coating and a transparent conductive film or coating. The crystal is mounted on a thermoelectric Peltier cooler 15 with a controller 16 to control its temperature. The unnecessary reflected beams are sent to beam traps 17, 18 and 19 comprised of neutral density filters tilted at Brewster's angle to eliminate reflection. This is to reduce the scattered light level in the filter housing 10 in order to obtain the highest possible image contrast.

Figure 2:
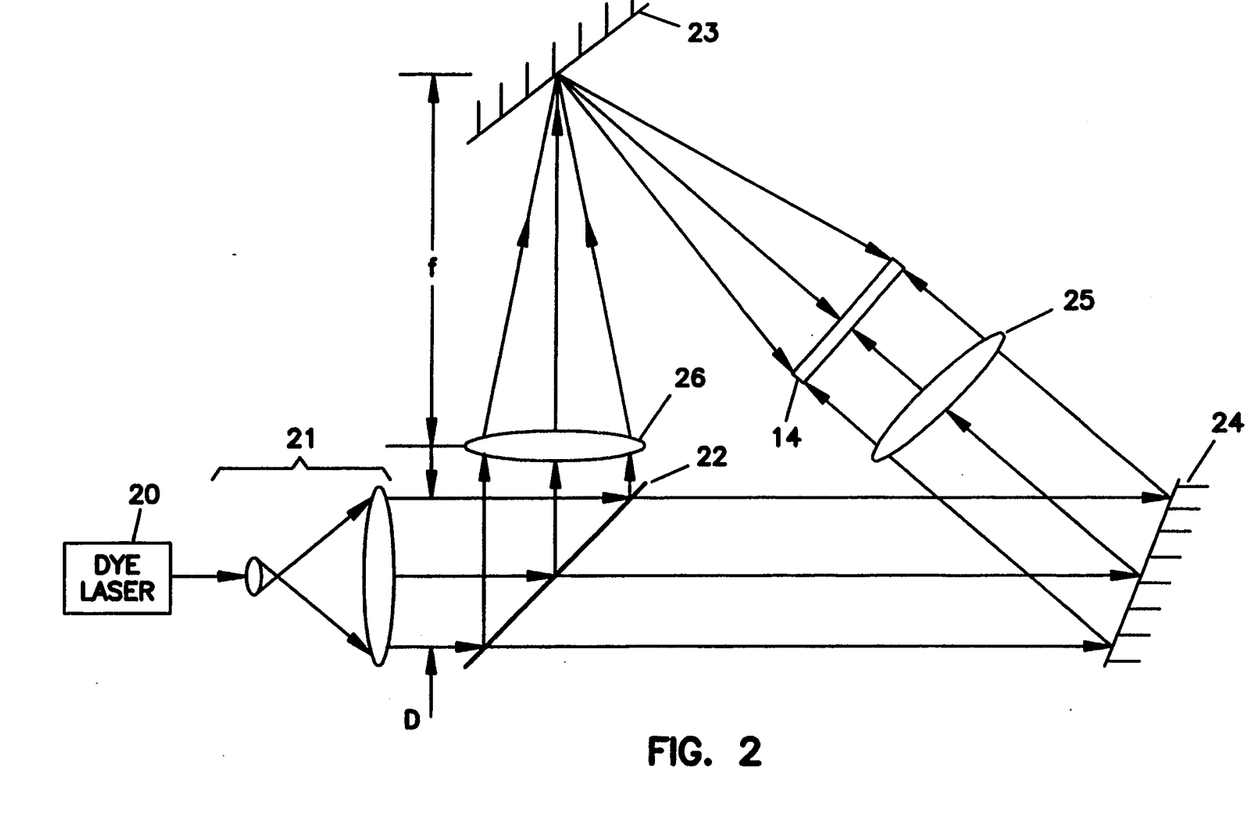
FIG. 2 is a schematic diagram of the configuration used to write the gratings in the holographic $H_\alpha$ filter.

The holographic gratings are written in the crystal using the configuration shown in FIG. 2. Light at the proper wavelength from a dye laser 20 is expanded by the beam expander 21 and directed through the beamsplitter 22 into a counter-propagating ring configuration bounded by the mirrors 23 and 24. In the solar filter application, curved gratings are written in the crystal 14 using phase conjugate pairs of converging and diverging beams in order to obtain normal incidence reflection at large apertures (i.e., small f-numbers) and therefore obtain the maximum field of view when used in conjunction with a telescope. The focal point of the two lenses 25 and 26 is coincident at one mirror 23, as shown in FIG. 2, to aid in alignment. The system is aligned to obtain a null at the beamsplitter 22, indicating that the wavefronts of the two beams are exact phase conjugate pairs.

By varying the f-number (or focal length ÷ aperture) of the lenses used during writing, any minimum f-number can be specified for the filter. For applications requiring planar (instead of curved) gratings, the lenses are not used in the configuration illustrated in FIG. 2 (corresponding to an infinite f-number). The thickness of the grating determines its FWHM spectral bandwidth, which is given by $$\Delta\lambda = \frac{\lambda_0^2}{2n_0 l} \quad (1)$$

where $\lambda_0$ is the wavelength, $n_0$ is the index of refraction, and $l$ is the grating thickness.

A stabilized single frequency Coherent 699 dye laser with its wavelength monitored by a Burleigh Wavemeter is used to write the gratings for the filter. In order to obtain a high quality, narrow linewidth, high diffraction efficiency grating, careful control of air currents, vibration, and laser wavelength is essential. As part of this process, active control of the dye laser is used to prevent mode-hopping of the output during the writing stage. The temperature and writing wavelength are controlled so the grating will operate on band at the desired wavelength at around 20° C. A thin film of carbon is applied on the surfaces of the crystal during the writing phase to improve its diffraction efficiency in accordance with the parent patent applications by G. A. Rakuljic and A. Yariv, supra. The present embodiment, however, coats the crystal with a permanent transparent conductive coating such as SnO or a thin layer of metal.

For the fixing and developing process, the parent patent applications by G. A. Rakuljic and A. Yariv, supra, specified that the photorefractive crystal be heated while in the shorted state to form a strong, permanent ionic distribution to compensate the electronic space charge pattern. The crystal is then cooled back to room temperature, and the original electronic distribution is erased (developing) by illuminating it with a strong beam while the crystal is held in an open circuited configuration to allow large photovoltaic fields to develop and enhance this process. An expanded beam from the Ar-ion laser is usually used as the illumination beam for developing. Experiments with 2mm thick LiNbO3 crystals, which are nominally 0.5 Å filters at 650 nm from Eqn. (1), verify the expected results from this process.

However, with highly doped, thick LiNbO3 crystals (>4 mm thick for wavelengths of about 650nm), the pre-fixed, metastable grating has a narrow bandwidth consistent with theory, but the fixing and developing process results in chirped gratings, i.e., broadened from the expected theoretical value. The grating also has been found to have a lower peak diffraction efficiency in conjunction with the wider bandwidth, while the total throughput remains unchanged. In addition, center wavelength drift is also observed in the crystal as well. These effects, although small relative to the bandwidth of the 0.5 Å (2 mm thick) filter, become more significant as the filter bandwidth is reduced in the thicker crystals. As the bandwidth is reduced to around 0.125 Å in the 8 mm crystals, the chirp and wavelength shifts that are negligible in the 0.5 Å holographic filter now have a significant effect on the performance of these narrower filters.

These phenomena can be traced to the developing process and attributed to non-uniform distortion in the gratings due to high internal fields from the photovoltaic and pyroelectric effects generated when the crystal was illuminated with intense light. The photovoltaic field arises from illumination during development and use, being given by $$E_{PV} = \frac{\kappa_{PV} \alpha I}{\sigma_p + \sigma_d} \approx \frac{\kappa_{PV} \alpha I}{\sigma_p} \quad (2)$$

where $\kappa_{PV}$ is the photovoltaic constant, $\alpha$ is the absorption, $I$ is the total illumination intensity, $\sigma_p$ is the photoconductivity, and $\sigma_d$ is the dark conductivity ($<<\sigma_p$ for large I). During developing and operational use of the filter, it has been determined that exposure to incident radiation can cause large fields to build up in the crystal through the photovoltaic effect, which physically distorts the crystal and therefore the gratings contained within. The pyroelectric field is generated from temperature changes used to fine-tune the operating wavelength of the filter, causing a similar internal electric field to build up in the crystal. The use of an ion laser output, with a high concentration of blue light, as the erase beam during developing also is thought to contribute to this linewidth broadening effect due to the high absorption in these crystals at these wavelengths, causing a non-uniform erasure of the original electronic grating.

The deleterious effects of grating linewidth broadening and reduced peak reflectivity with a highly doped, thick crystal are now recognized to occur as a result of stresses induced in the crystal by the large internal fields. Such a crystal is responsive to unintended internal electric fields at a level that becomes apparent when a very narrow bandwidth hologram is written. By eliminating these fields during developing and use of the filter, superior narrowband performance can be achieved despite reductions in theoretical developing efficiency. By maintaining the crystal in the short-circuited state during developing and operational use, the extremely narrowband grating more than compensates for the fact that the best developing efficiency is theoretically obtained with an open circuit condition, thus giving a net improvement in the reflectivity of the grating.

Figure 3A:
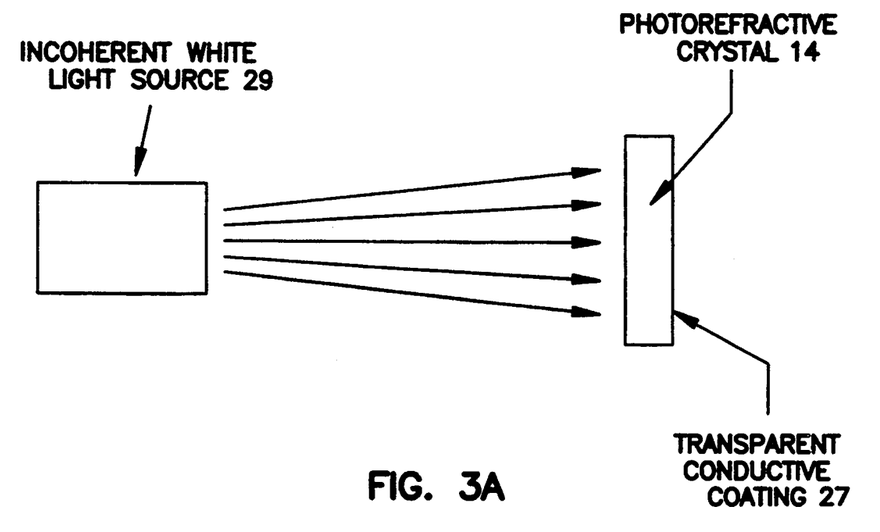
FIGS. 3A and 3B illustrate the processes for developing as set forth in the present invention, wherein the metastable electronic grating in the photorefractive crystal is erased, leaving only the permanent ionic grating, while the crystal is shorted to neutralize internal electronic fields.
Figure 3B:
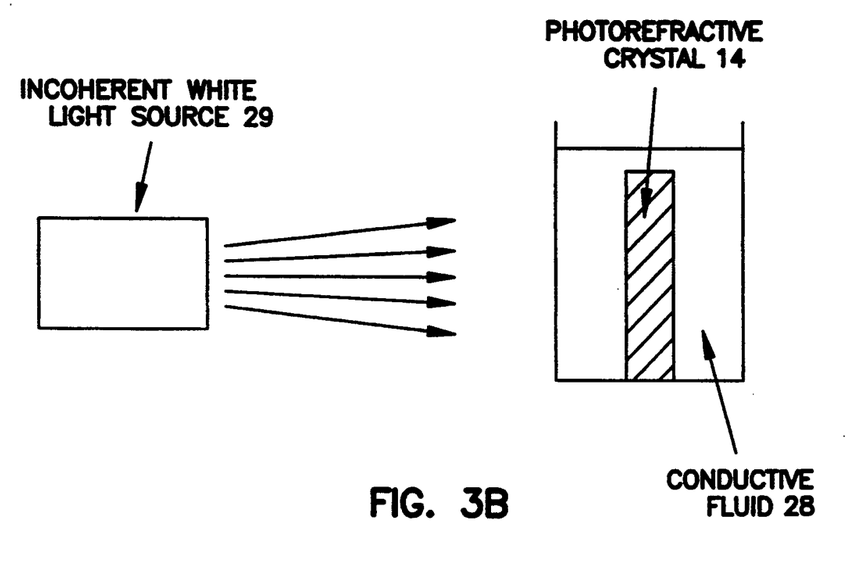

The developing methods as set forth in the present invention are illustrated in schematic form in FIGS. 3A and 3B. FIG. 3A shows a permanent transparent conductive coating 27, such as a thin metallic film (with only a few percent reflection to minimize the optical loss), which is one method for shorting the crystal 14 during developing, since the carbon coating used for temporary shorting in the writing stage, as described in the parent patent applications by G. A. Rakuljic and A. Yariv, supra, can absorb water and degrade with time. A conductive anti-reflection coating 27 such as SnO can also be used. FIG. 3B shows another method for shorting the crystal 14 during developing, which is to immerse it in a conductive fluid 28. In either method, an incoherent 150W incandescent flood lamp 29 (instead of a laser) is used to illuminate the crystal 14. This source 29 avoids generating secondary gratings or self-enhancement effects from using coherent light and provides more uniform development. The crystal 14 is exposed for several hours, during which the crystal 14 is kept cool to avoid overheating from the lamp 29.

Analysis of the theoretical diffraction efficiencies for both the short-circuited and open-circuited states shows that for reflection mode gratings, the electrical condition during the final developing stage is not as critical compared to the case of transmission mode gratings. The fixing efficiency denotes a ratio of grating strengths after and before fixing, and is given by $$\gamma_{FIX} = \left| \frac{E_q(E_{PV} + iE_d)}{(E_d + E_q)(E_d^{(T)} + E_q^A)} \right| \quad (3)$$

for sequential writing and fixing. Similarly, the developing efficiency is given by $$\gamma_{DEV} = \frac{E_0 + iE_d}{E_0 + i(E_d + E_q)} \quad (4)$$

where $$E_d = \frac{k_B T K}{e} \quad (5a)$$

$$E_q = \frac{e N_A}{\epsilon K}\left(1 - \frac{N_A}{N_0}\right) \quad (5b)$$

$N_A$ is the ion density, $N_o$ is the total dopant density, $k_B$ is Boltzman's constant, T is the temperature, K is the grating wavenumber, $\epsilon$ is the permittivity, and e is the electronic charge. Therefore, the final efficiency of conversion from the metastable to permanent gratings is given by $$\gamma_{FINAL} = \gamma_{FIX}\gamma_{DEV} \quad (6)$$

which is shown in Table 1 for both the transmission mode case where $\Lambda_g$ is typically 1 μm, and the counter-propagating reflection mode case where $\Lambda_g = 0.109$ μm at λ=500 nm. From these theoretical values, the developing efficiency in the reflection mode case is about 10 times less sensitive to electrical conditions during developing (i.e., whether it is shorted or open circuited) than transmission mode. Therefore, the effects of shorting the crystal during development in this embodiment should not be significant for reflection mode gratings. Moreover, the theoretical calculations do not consider the effects of non-uniform developing due to absorption of the illuminating beam, which is reduced by using incoherent white light as the illumination source during developing.

Figure 4:
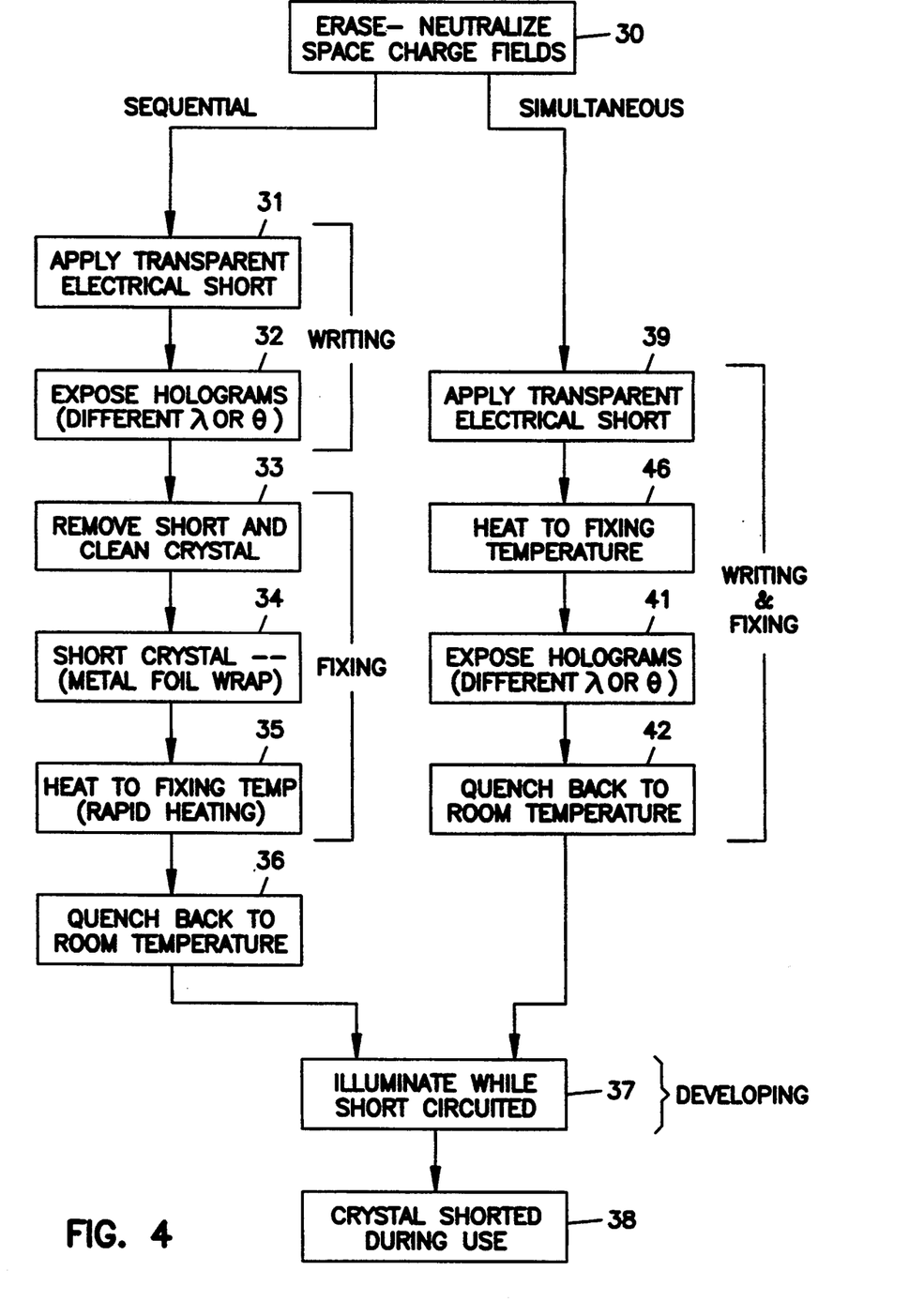
FIG. 4 is a block diagram of the steps of the new method for writing, fixing, and developing holograms in photorefractive materials in accordance with the present invention.

FIG. 4 is a flow chart describing the fixing process for gratings in the narrow linewidth holographic filter for both the sequential and simultaneous methods. Considering the conditions responsible for grating chirp and non-uniform field buildup, the process for the sequential writing and fixing case is as follows:

Steps 31–32: The holographic grating is written in the photorefractive crystal using counter-propagating reflection mode geometry while it is shorted with a transparent conducting film.

Steps 33–36: The crystal is heated to its fixing temperature (generally about 160° C.) while it is shorted, and then it is allowed to cool down after a few minutes at the high temperature.

Step 37: The crystal is developed by exposing it to incoherent white light while it is shorted with a transparent conducting material or by immersion in a conductive fluid.

Step 38: The transparent conducting film is left on the crystal during use.

For the simultaneous writing and fixing process, the first two steps 31 and 32 are combined into steps 39–42 by heating the crystal with a transparent conductive coating, exposing the holograms (with the wavelength shifted to the red by approximately 1 Å per 30° C. to compensate for thermal expansion), and cooling back to room temperature. The final, developing step 38 remains the same.

Figure 5:
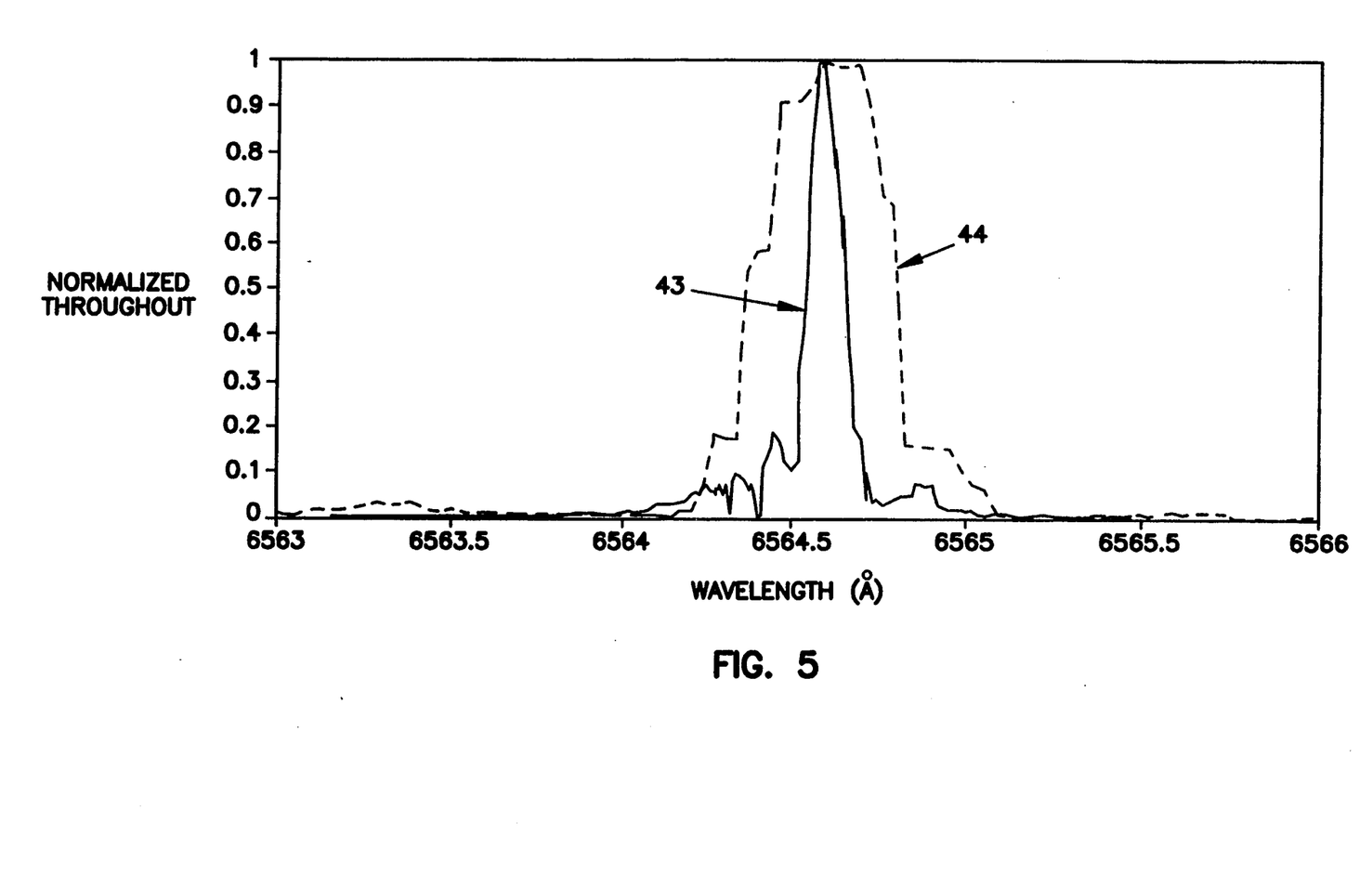
FIG. 5 is the plot showing the measured spectral response of an $H_\alpha$ filter fabricated using the method set forth in the present invention, with the reflectivity normalized to the peak shown in a linear scale along the ordinate, and with the response of a 0.5 Å Lyot filter superimposed.

The spectral properties of the holographic filter fabricated using the method set forth in this disclosure is shown as a linear plot 43 of normalized reflectivity in FIG. 5, with a trace 44 of 0.5 Å Lyot filter superimposed for comparison. A peak diffraction efficiency of over 40% after fixing was measured, with a grating FWHM of 0.12 Å in an 8 mm thick substrate, which is consistent with theoretical calculations from Eqn. (1). When beamsplitter losses are considered in the system in FIG. 1, the total filter throughput will be approximately 10%, which is approximately the same as the Lyot. The holographic filter has a −40 dB sidelobe level 1 Å away from the center wavelength, as shown in the logarithmic plot 45 in FIG. 6 (again, with a Lyot plot 46 superimposed), which is significant for blocking filter applications. In comparison, when the open-circuited developing method is used, a maximum of 10% reflectivity (2.5% throughput) with >0.5 Å (FWHM) bandwidth is obtained with the same crystal under otherwise identical conditions.

Figure 6:
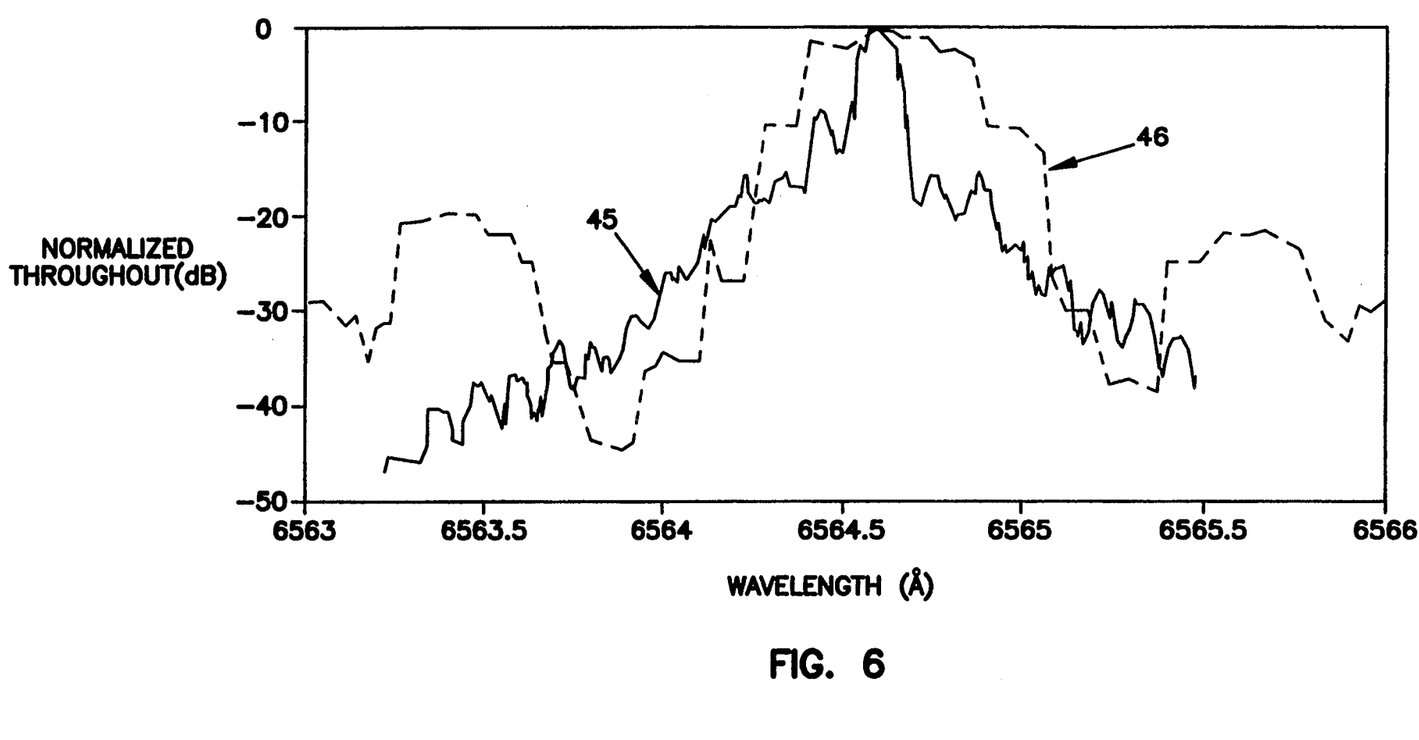
FIG. 6 is the plot showing the measured spectral response of an $H_\alpha$ filter fabricated using the method set forth in the present invention, with a $-40$ dB sidelobe level at 1 Å away from the center wavelength, and with the response of a 0.5 Å Lyot filter superimposed.

As shown by the experimental data in FIGS. 5 and 6, the holographic filter as set forth in the present invention significantly outperforms the 0.5 Å bandwidth Lyot filter, which represents the current state of the art (at a cost of $100,000). The holographic filter has a bandwidth ¼ that of the Lyot, in addition to significant sidelobe suppression levels (10 dB or more over the Lyot filter at 1 Å away from the peak). Moreover, the throughput of the holographic filter as used in the operational configuration illustrated in FIG. 1, with beamsplitter losses, is about the same as the Lyot.

Since in this embodiment the crystal is to be shorted throughout the writing, fixing, and developing stages and also during use, a permanent transparent conductive coating is applied on the crystal surface. One option is to evaporate a thin metallic coating, such as silver or aluminum, which is thin enough to have only a few percent reflection, but with sufficient conductivity to drain the surface charges generated by the photovoltaic or pyroelectric effects. Another expedient is to use a conductive AR coating, such as SnO, on the crystal, which serves to reduce the surface reflection problem as well as shorting the crystal.

There are other applications in addition to narrow bandwidth filters that can benefit from this new fixing process. Optical data storage using the orthogonal data storage approach (G. A. Rakuljic, V. Leyva, and A. Yariv "Optical data storage using 'orthogonal' wavelength multiplexed volume holograms," Opt Lett., vol 17, pp 1471–1473 (1992)) can also benefit from the ability to store permanent, high spectral resolution, wavelength multiplexed holograms in photorefractive materials. Moreover, the extremely low sidelobe levels shown in FIG. 6 indicate that holograms can be stored less than 1 Å apart in 8 mm thick crystals with significant (i.e., 25 dB) signal-to-noise ratios, corresponding to a bit error rate (BER) of less than $10^{-11}$ (cf., A. Yariv, Optical Electronics, (New York, Holt, Rinehart, and Winston, 1985)), greatly improving the storage density possible compared to the previous orthogonal data storage results using 2 mm thick crystals shown in the parent patent applications by G. A. Rakuljic and A. Yariv, Supra. Holographic output couplers for precision frequency lasers are another application that requires permanently fixed holograms, preferably with extremely narrow bandwidths, where this new refinement of the fixing technique is advantageous.

The foregoing description of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

TABLE 1

Theoretical Fixing and Developing Efficiency

| | | $N_{A0} = 10^{17}$ cm$^{-3}$ | | | | | |
|---|---|---|---|---|---|---|---|
| | | Transmission | | | Reflection | | |
| $E_{PV}$(kV/cm) = | | 1 | 5 | 10 | 1 | 5 | 10 |
| γFIX | Short | 0.020 | 0.056 | 0.108 | 0.187 | 0.197 | 0.226 |
| γdev | Short | 0.017 | 0.017 | 0.017 | 0.599 | 0.599 | 0.599 |
| γdev | Open | 0.021 | 0.057 | 0.110 | 0.600 | 0.620 | 0.672 |
| γFinal | Sh, Sh | 0.0003 | 0.001 | 0.0019 | 0.112 | 0.118 | 0.135 |
| γFinal | Sh, Op | 0.0004 | 0.003 | 0.012 | 0.112 | 0.122 | 0.152 |
| | | $N_{A0} = 10^{18}$ cm$^{-3}$ | | | | | |
| | | Transmission | | | Reflection | | |
| $E_{PV}$(kV/cm) = | | 10 | 50 | 100 | 10 | 50 | 100 |
| γFIX | Short | 0.0112 | 0.0554 | 0.111 | 0.129 | 0.380 | 0.737 |
| γdev | Short | 0.0018 | 0.0018 | 0.0018 | 0.130 | 0.130 | 0.130 |
| γdev | Open | 0.011 | 0.055 | 0.110 | 0.157 | 0.424 | 0.672 |
| γFinal | Sh, Sh | $2 \times 10^{-5}$ | 0.0001 | 0.0002 | 0.017 | 0.049 | 0.096 |
| γFinal | Sh, Op | 0.00013 | 0.0031 | 0.0122 | 0.020 | 0.161 | 0.495 |

We claim:

1. The method of developing a uniform electron distribution in a photorefractive crystal having a fixed grating formed by displaced electron patterns compensated locally by equalizing ionic displacements, comprising the steps of:
    applying a thin transparent conductive coating to the crystal;
    coupling an electrical potential to the coating to dissipate potential electrical fields in the crystal; and
    illuminating the crystal with a distributed beam having multiple wavelength components to migrate the electrons to a uniform disposition due to the photorefractive effect.

2. The method of claim 1 above, wherein the crystal has a thickness of greater than 2 millimeters in the c-axis direction, and wherein the step of illuminating the crystal comprises the step of directing a beam of incoherent white light into the crystal.

3. The method of developing a fixed hologram of narrow bandwidth in a photorefractive medium, comprising the steps of:
    illuminating the medium with coherent electromagnetic wave energy while maintaining the medium short circuited to establish a diffraction pattern therein;
    thermally fixing the diffraction pattern in the medium while the medium is short-circuited; and
    developing the diffraction pattern by illuminating the medium while minimizing the generation of non-AC electrical potential therewithin.

4. The method of claim 3 above, wherein the step of developing comprises the steps of coating the medium with a transparent conductive layer and coupling the layer to an electric potential.

5. The method of claim 4 above, further comprising the step of applying the transparent conductive layer to the medium prior to initial illumination.

6. The method of claim 5 above, wherein the transparent conductive layer is a thin metallic coating, and wherein the step of developing the diffraction pattern comprises the step of illuminating the medium with incoherent, broadband electromagnetic radiation.

7. The method of claim 6 above, wherein the photorefractive medium comprises a crystal having a thickness of greater than about 2mm, the crystal being LiNbO$_3$, and further comprising the steps of illuminating the crystal with counter-propagating beams that are wavelength stabilized to provide a sub-Angstrom bandwidth image.

8. The method of claim 6 above, wherein the step of developing comprises the step of maintaining the illumination in excess of one hour, and wherein the image after developing has a bandwidth of less than about 0.5 Angstroms in the visible light spectrum.

9. The method of claim 5 above, wherein the layer is an electrically conductive anti-reflection coating, and wherein the step of developing the diffraction pattern comprises the step of illuminating the medium with incoherent, broadband electromagnetic radiation.

10. The method of claim 9 above, wherein the photorefractive medium comprises a crystal having a thickness of greater than about 2mm, the crystal being LiNbO$_3$, and further comprising the steps of illuminating the crystal with counter-propagating beams that are wavelength stabilized to provide a sub-Angstrom bandwidth image.

11. The method of claim 9 above, wherein the step of developing comprises the step of maintaining the illumination in excess of one hour, and wherein the image after developing has a bandwidth of less than about 0.5 Angstroms.

12. The method of generating a high diffraction efficiency hologram image of sub-Angstrom bandwidth at half height in a photorefractive element having a thickness of the order of millimeters in the c-axis direction, comprising the steps of:
    writing a diffraction grating in the element with the planes of the grating being substantially transverse to the element's c-axis,
    the grating being written with a wavelength stabilized beam and with the element being shorted;
    fixing the diffraction grating thermally while the element is shorted; and
    developing the grating while the element is shorted.

13. The method as set forth in claim 12 above, further comprising the step of cooling the element after the fixing step.

14. The method as set forth in claim 12 above, further comprising the step of maintaining the element in a shorted condition while in use.

15. The method as set forth in claim 14 above, further comprising the steps of applying a thin coating of conductive material on the element to electrically short the element and then writing a diffraction grating in the reflection mode, wherein the coating reduces reflection loss when writing the grating.

16. The method as set forth in claim 14 above, further comprising the steps of applying an electrically conductive anti-reflection coating on the element to electrically short the element and then writing a diffraction grating in the reflection mode, wherein the coating reduces reflection loss when writing the grating.

17. A narrow band optical filter for reflecting only a sub-Angstrom band of energy from a wide band illuminating source, comprising a crystal having a thickness in its c-axis direction in excess of about 2mm, more than about 0.05% dopant, and a holographic grating image fixed therein of less than about 0.5 Angstrom bandwidth at half height.

18. A filter as set forth in claim 17, wherein the grating defines a curvilinear holographic reflector, and the filter further comprises means for tuning the spectral bandwidth.

19. A filter as set forth in claim 18, wherein the crystal comprises a photorefractive crystal of $LiNbO_3$ having a coating thereon, wherein the coating is a metallic coating providing in excess of 95% transmissivity, and wherein the means for tuning comprises means for varying the temperature of the crystal.

20. The filter as set forth in claim 19 above, wherein the filter is responsive to solar illumination and is reflective at the $H_{60}$ wavelength of 6562.8 Angstroms and a spectral bandwidth of the filter is less than about 0.5 Angstroms.

21. The method of developing a permanent ionic grating of sub-Angstrom bandwidth at half height from compensating an electronic grating with an ionic distribution in a photorefractive crystal, comprising the steps of:
   inhibiting the internal buildup of photovoltaic and pyroelectric fields in the crystal; and
   erasing the electronic grating by redistributing the electrons uniformly within the crystal.

22. The method as set forth in claim 21 above, wherein the ionic and electronic gratings each comprises a counter-propagating reflection mode hologram and wherein the fields are held at substantially zero.

23. The method as set forth in claim 22 above, wherein a coupling constant $\kappa$ for the electronic grating is in excess of 0.4 cm$^{-1}$, and the erasing step further comprises the steps of erasing the electronic grating with white light for a substantially longer interval than an interval used for writing the electronic grating, and maintaining the coupling constant after the erasing step by inhibiting the generation of internal electrical fields by subsequent incident radiation.

24. The method as set forth in claim 23 above, wherein the crystal has a thickness l in excess of 1 mm and a developed grating that has a diffraction efficiency in excess of 5% of pre-fixed diffraction efficiency.

25. The method as set forth in claim 21 above, wherein the erasing step comprises illuminating the electronic grating with non-coherent electromagnetic wave energy occupying a wavelength band that is of the same order of magnitude as the electronic grating's wavelength band.

26. A narrow bandwidth filter system for imaging incoming light beams at a specified wavelength, comprising:
   a volume holographic grating generating reflected output beams from the incoming light beams, wherein the reflected output beams have wavelengths matching the specified wavelength; and
   beam traps comprised of neutral density filters oriented at Brewster's angle to absorb stray reflections, thereby improving contrast.

27. The invention as set forth in claim 26 above, further comprising a bandpass prefilter for generating improved contrast incoming light beams.

28. The invention as set forth in claim 26 above, further comprising one or more polarizing beam splitters for polarizing the improved contrast incoming light beams.

29. The invention as set forth in claim 26 above, wherein the volume holographic grating is written in a photorefractive $LiNbO_3$ crystal.

30. The invention as set forth in claim 29, above, wherein the photorefractive $LiNbO_3$ crystal is coated with a permanent transparent conductor and has a thickness of about 8mm for a FWHM bandwidth of 0.12 Angstroms.

31. The invention as set forth in claim 29 above, wherein the photorefractive $LiNbO_3$ crystal is coated with a permanent transparent conductor and has a thickness of about 4mm for a FWHM bandwidth of 0.25 Angstroms.

32. The invention as set forth in claim 29 above, wherein the photorefractive $LiNbO_3$ crystal is coated with a permanent transparent conductor and has a thickness of about 2mm for a FWHM bandwidth of 0.5 Angstroms.

33. The invention as set forth in claim 29 above, wherein the photorefractive $LiNbO_3$ crystal is mounted on a thermoelectric Peltier cooler having a controller to control the crystal's temperature.

* * * * *

UNITED STATES PATENT AND TRADEMARK OFFICE
CERTIFICATE OF CORRECTION

PATENT NO. : 5,335,098
DATED : August 2, 1994
INVENTOR(S) : Victor Leyva, et al.

It is certified that error appears in the above-identified patent and that said Letters Patent is hereby corrected as shown below:

Column 2, line 65, before "as the" (first occurrence) insert --photorefractive materials for use in narrow band filters such--; lines 66-67, after "The" and before "present" strike "photorefractive materials for use in narrow band filters such".

Column 3, line 57, after "Å" insert a comma (--,--).

Column 6, line 17, before "is" (first occurrence), "/" should read --I--.

Column 11, line 29, "$H_{60}$" should read --$H_\alpha$--.

In the Abstract, line 4, "$H_{60}$" should read --$H_\alpha$--.

Signed and Sealed this

Twenty-first Day of March, 1995

BRUCE LEHMAN

*Attest:*

*Attesting Officer*  *Commissioner of Patents and Trademarks*